United States Patent
Ge et al.

(10) Patent No.: US 10,170,180 B2
(45) Date of Patent: Jan. 1, 2019

(54) MEMORY INCLUDING BI-POLAR MEMRISTOR

(71) Applicant: HEWLETT-PACKARD DEVELOPMENT COMPANY, L.P., Houston, TX (US)

(72) Inventors: Ning Ge, Palo Alto, CA (US); Wai Mun Wong, Singapore (SG); Leong Yap Chia, Singapore (SG); Ser Chia Koh, Singapore (SG)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

(21) Appl. No.: 15/547,123

(22) PCT Filed: Apr. 30, 2015

(86) PCT No.: PCT/US2015/028447
§ 371 (c)(1),
(2) Date: Jul. 28, 2017

(87) PCT Pub. No.: WO2016/175822
PCT Pub. Date: Nov. 3, 2016

(65) Prior Publication Data
US 2018/0012654 A1    Jan. 11, 2018

(51) Int. Cl.
*G11C 11/00*    (2006.01)
*G11C 13/00*    (2006.01)
(Continued)

(52) U.S. Cl.
CPC ......... *G11C 13/0016* (2013.01); *B41J 2/0458* (2013.01); *B41J 2/04541* (2013.01); *B41J 2/1753* (2013.01); *G11C 7/04* (2013.01); *G11C 11/5664* (2013.01); *G11C 13/003* (2013.01); *G11C 13/0007* (2013.01); *G11C 13/0023* (2013.01); *G11C 13/0026* (2013.01); *H01L 27/2409* (2013.01); *H01L 27/2463* (2013.01); *H01L 45/146* (2013.01); *B41J 2202/13* (2013.01); *G11C 2213/72* (2013.01); *G11C 2213/74* (2013.01); *G11C 2213/78* (2013.01); *G11C 2213/79* (2013.01)

(58) Field of Classification Search
CPC ... G11C 13/0016; G11C 7/04; G11C 11/5664; H01L 27/2409; H01L 27/2463
USPC ....................................................... 365/148
See application file for complete search history.

(56) References Cited

U.S. PATENT DOCUMENTS

| | | | |
|---|---|---|---|
| 6,870,751 | B2 | 3/2005 | Van Brocklin et al. |
| 2006/0215439 | A1 | 9/2006 | Bill et al. |

(Continued)

OTHER PUBLICATIONS

Kannan, S., et al., Secure Memristor-based Main Memory, Apr. 4, 2014, DAC '14, Jun. 1-5, 2014, San Francisco, CA, 6 pages.

*Primary Examiner* — Huan Hoang
(74) *Attorney, Agent, or Firm* — HP Inc.—Patent Department

(57) ABSTRACT

A memory cell includes an input coupled to a read line, an output coupled to a circuit ground, a bi-polar memristor, and at least one address switch coupled to an address line to select the memory cell. A memory includes the bi-polar memristor and a one-way current conducting device, wherein the one-way current conducting device is positioned between the memristor cell output and the circuit ground, or between the read line and the memristor cell input.

15 Claims, 5 Drawing Sheets

(51) Int. Cl.
*B41J 2/045* (2006.01)
*B41J 2/175* (2006.01)
*G11C 7/04* (2006.01)
*G11C 11/56* (2006.01)
*H01L 27/24* (2006.01)
*H01L 45/00* (2006.01)

(56) References Cited

U.S. PATENT DOCUMENTS

| | | |
|---|---|---|
| 2007/0019464 A1* | 1/2007 | Ezaki et al. ............ G11C 11/16 365/158 |
| 2008/0212361 A1 | 9/2008 | Bertin et al. |
| 2012/0127779 A1 | 5/2012 | Scheuerlein et al. |
| 2013/0106930 A1 | 5/2013 | Lea et al. |
| 2014/0027702 A1 | 1/2014 | Lu et al. |
| 2014/0247649 A1* | 9/2014 | Wang et al. ....... G11C 13/0069 365/148 |
| 2014/0268994 A1 | 9/2014 | Rose et al. |
| 2017/0316822 A1* | 11/2017 | Sei et al. ........... G11C 13/0004 365/148 |

\* cited by examiner

MEMORY INCLUDING BI-POLAR MEMRISTOR

BACKGROUND

A memristor is a device that changes resistance depending upon a potential difference that has been applied across the memristor during a switching event. As the resistance changes upon a switching event, the memristor may be used as a memory. Applying a potential difference above a first threshold to the memristor may set the memristor to a low resistance state, commonly known as an ON state. Switching the memristor to the ON state is known as setting the memristor. Applying a potential difference below a second threshold may switch the memristor to an OFF state, having a high resistance. This is known as resetting the memristor.

In the case of a bi-polar memristor, the first threshold and second threshold are potential differences of opposite polarity. Thus, for example, a positive potential difference above a first threshold, may set the memristor to an ON state. A negative potential difference below a second threshold may reset the memristor to an OFF state. A memory array may include a plurality of memory cells, each memory cell including a memristor.

BRIEF DESCRIPTION OF THE DRAWINGS

Examples will now be described, by way of non-limiting example only, with reference to the accompanying drawings, in which.

DETAILED DESCRIPTION

In the following description the terms "a" and "an" are used to denote the presence of one or more of a particular element.

The circuits and memory arrays described herein have many possible applications. One possible application is as a memory on an electronic device, such as a fluid ejection device. Other examples of devices in which the memory may be used include system on chip devices, embedded systems, personal computing devices and all manner of consumer devices. An example memory circuit will be described first, before describing an example device in which the memory circuit may be used.

The present disclosure proposes a memory circuit including a bi-polar memristor and a one-way current conducting device. A one-way current conducting device is a device that is capable of conducting current in a first direction, but which does not allow current to flow in the opposite direction, or allows just a very low level of current to flow in the opposite direction. The one-way current conducting device may prevent a large negative potential difference being applied across the memristor, thus preventing the memristor from being reset. This may help to prevent counterfeit product manufacturers and others, from changing the contents of a memory. For instance, if the memory stores product identification data uniquely identifying a product, or anti-counterfeit codes, or information used to facilitate operation of an electronic product, then the one-way current conducting device may prevent such information being deleted, overwritten or changed.

Figure 1A:
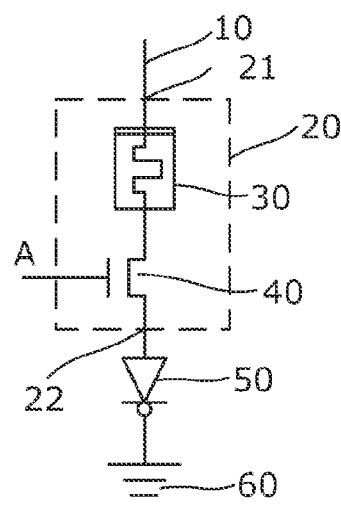
FIGS. 1A to 1D show examples of a memory circuit including a memristor.

FIG. 1A shows an example memory circuit. The memory circuit includes a memory cell on a conductive path between a read line 10 and a circuit ground 60. The extent of the memory cell 20 is indicated nominally by dashed lines. Thus it can be seen that the memory cell 20 includes a bi-polar memristor 30 and an address switch 40. An input 21 of the memory cell is coupled to read line 10 and an output 22 of the memory cell is coupled to circuit ground 60. It should be noted that the input 21 and output 22 are nominal input and output points and there may not necessarily be a visible dividing line between the read line and the input or between the output and the line to the circuit ground.

While in FIG. 1A, the address switch 40 is shown positioned between the bi-polar memristor and the memory cell output 22, in other examples the address switch 40 may be positioned between the memory cell input 21 and the bi-polar memristor 30. In any case when the address switch 40 is turned on it may connect the bi-polar memristor 30 to an input or output of the memory cell.

The address switch 40 may be turned on by a signal on the address line A. For instance, the address switch 40 may be a transistor with a gate coupled to the address line A. When switched on, the address switch 40 selects the memory cell. For example, the address switch 40 may select the memory cell by completing a conductive path between the memory cell input, the bi-polar memristor 30 and the memory cell output. This conductive path may allow the content of the memory cell to be read. For instance, in order to read the memory cell a positive voltage may be applied to the read line 10, so that a current flows through the memory cell to the circuit ground 60. The level of current may be sensed and used to determine whether the bi-polar memristor is ON or OFF.

As shown in FIG. 1A, a one-way current conducting device, in the form of a diode 50, is coupled between the memory cell output and the circuit ground 60. This one-way current conducting device may prevent a negative current from flowing in the direction from the circuit ground 60 to the read line 10. Thus, even if a large positive voltage is applied to a ground line of the circuit, the bi-polar memristor 30 will not be reset. This can be useful to stop counterfeiters from deleting or re-writing the contents of the memory cell.

The diode in FIG. 1A, and also diodes in the further examples, described in other Figures, may be any suitable type of diode. In one example it is a diode having a breakdown voltage that is more than 10V. In another example 19V or more and in still another example between 19V and 25V. In this case, as the diode does not breakdown until a relatively high voltage is applied, even if the diode is broken down the voltage may be such that the entire circuit is damaged. That is memory cell and/or other electronic components on the same semiconductor substrate may be damaged and no-longer function properly. Thus in one example, even by applying a voltage larger than the break down voltage of the diode, a counterfeiter cannot reset the memristor in a memory cell of an electronic device, without permanently damaging electronic components of the semiconductor substrate.

In one example the diode is a p-n junction diode. In one example it is a diode other than a Zener diode. In one example it is an avalanche diode.

A Zener diode is a diode that undergoes Zener breakdown on application of negative potential difference greater than the breakdown voltage of the diode. Zener breakdown is a breakdown which is caused by free electrons freed from covalent bonds at the junction, but not electrons freed by collisions. Zener break down is generally reversible by applying a positive potential difference under which the diode may reform. Thus, unlike many other types of diode, when a Zener diode is broken down to conduct a large negative current, the Zener diode may still be reformed by applying a positive potential difference again.

An avalanche diode is a diode which undergoes avalanche breakdown, on application of a negative potential difference, greater than the breakdown voltage of the diode. Avalanche breakdown is breakdown in which electrons at the junction are freed from covalent bonds by the potential difference and collide with neighboring atoms thus creating more free electrons which join the reverse current flow. Avalanche breakdown is irreversible and effectively destroys the diode and other circuit devices, such that once the diode has experienced avalanche break down it cannot be reformed by applying a positive potential difference again.

Another difference is that a Zener diode may maintain a significant resistance and voltage drop even after breakdown. For instance if the breakdown voltage is 10V then even after breakdown there may be a 10V drop across the diode. In contrast an avalanche diode generally does not maintain a large voltage drop after breakdown.

In terms of physical characteristics, a Zener diode tends to have a p-n junction with heavy doping and a thin junction, e.g. a thin depletion layer. Meanwhile, an avalanche diode tends to have a p-n junction with moderate doping and a thick junction, e.g. a thick depletion layer.

The breakdown voltage for an avalanche diode is typically much greater in magnitude than the break down voltage for a Zener diode. A Zener diode typically has quite a low break down voltage, for instance less than V. The breakdown voltage for an avalanche diode is typically much greater, for instance more than 10V. In one example the memory circuit uses a diode which has a breakdown voltage of at least 19V. In one example the diode has a breakdown voltage in the range 19-25V.

Figure 1B:
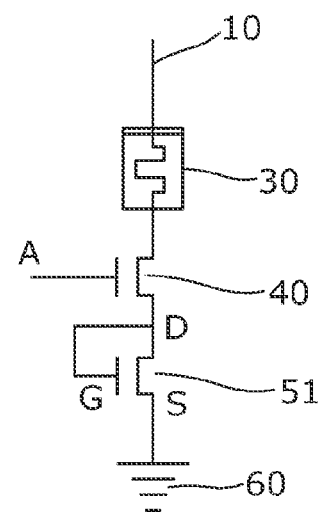

FIG. 1B shows a similar arrangement to FIG. 1A, except that instead of a diode 50, the one-way current conducting device is a, transistor 51. The transistor 51 may be field effect transistor (FET), such as a metal-oxide-semiconductor field effect transistor (MOSFET). The transistor 51 includes a gate G, a source S and a drain D. The gate G is coupled to the drain D, so that when voltage at the drain is high the transistor is on and current may flow. However, when the voltage at the drain D is low, then the voltage at the gate G is also low and current may not pass. Thus, for example, when a high voltage is applied on the read line 10, there is a positive potential difference between the read line 10 and the circuit ground 60. The voltage at drain D and gate G of the transistor 51 is high, so the transistor is on and current flows from the read line 10, through the memory cell including memristor 30, through the transistor 51 to circuit ground 60. However, if a high voltage is applied to the circuit ground line, creating a negative potential difference between the read line 10 and the circuit ground, then the voltage at the gate G and drain D of the transistor 51 is low and the transistor remains off, such that current cannot pass through the memory cell. Therefore a negative potential difference is not applied to the bi-polar memristor 30. Thus the transistor 51 acts in a similar manner to a diode to prevent the memristor from being reset. A transistor set up in this way may be referred to as a gate-drain coupled transistor.

Figure 1C:
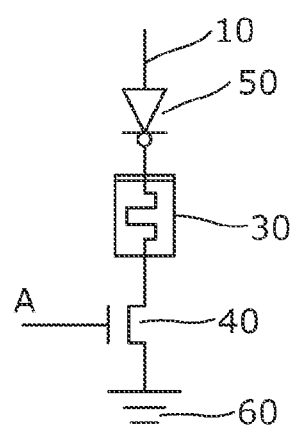
Figure 1D:
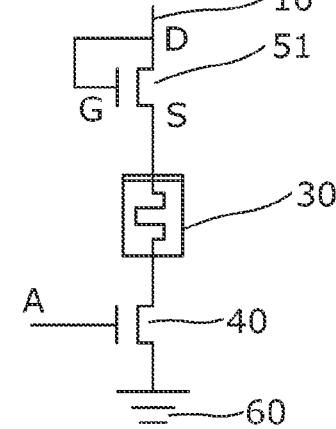

FIG. 1C shows an example similar to FIG. 1A, except that the diode 50 is placed on the read line 10. Otherwise the operation of the circuit is similar to FIG. 1A and the diode effectively prevents the bi-polar memristor 30 from being reset. FIG. 1D is similar to FIG. 1C, except instead of a diode 50 a transistor 51 with drain coupled to its gate is used as the one-way current conducting device.

FIG. 2 shows an array of memory cells. A first memory cell includes a bi-polar memristor 30 and a first address switch $A_1$ coupled to a first address line. The second memory cell includes a bi-polar memristor 31 and a second address switch $A_2$ coupled to a second address line. An input of the first memory cell is coupled to first read line 10 and an input of the second memory cell is coupled to a second read line 11. The outputs of both the first memory cell and second memory cell are coupled to a common line to ground 70 that connects to the circuit ground 60.

Figure 2A:
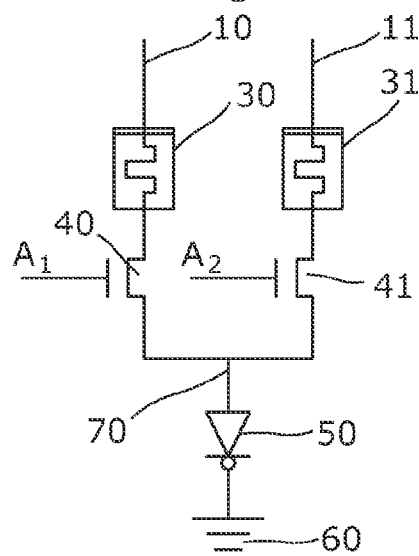
FIGS. 2A and 2B shows an example of a plurality of memory cells each including a memristor.

A one-way current conducting device, in this example a diode 50, is disposed on the common line to ground 70. Thus the one-way current conducting device effectively prevents both the first memory cell and the second memory cell from being reset by passing a negative current through the memristors of either memory cell. While two memory cells are shown in the example of FIG. 2A, in other examples there may be three or more memory cells connected to the common line to ground. Thus a single one-way current conducting device, such as diode 50, may prevent resetting of a plurality of memristors. This arrangement saves space compared to having a separate diode for each memory cell or memristor. In many electronic devices, space is at a premium and thus reducing the space needed brings about cost savings, or makes room for other components or functionality to be added to the device.

Figure 2B:
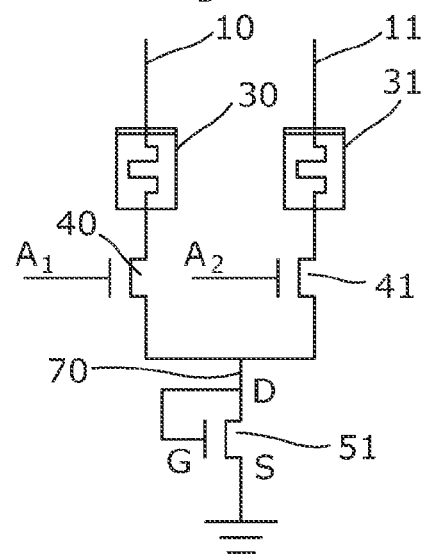

FIG. 2B is similar to FIG. 2A except that instead of a diode, a transistor 51 is used as the one-way current conducting device on the common line to ground 70. Thus a drain D of the transistor 51 and a gate G of the transistor 51 are coupled to the outputs of the memory cells and a source S of the transistor 51 is coupled to the circuit ground 60.

Figure 3A:
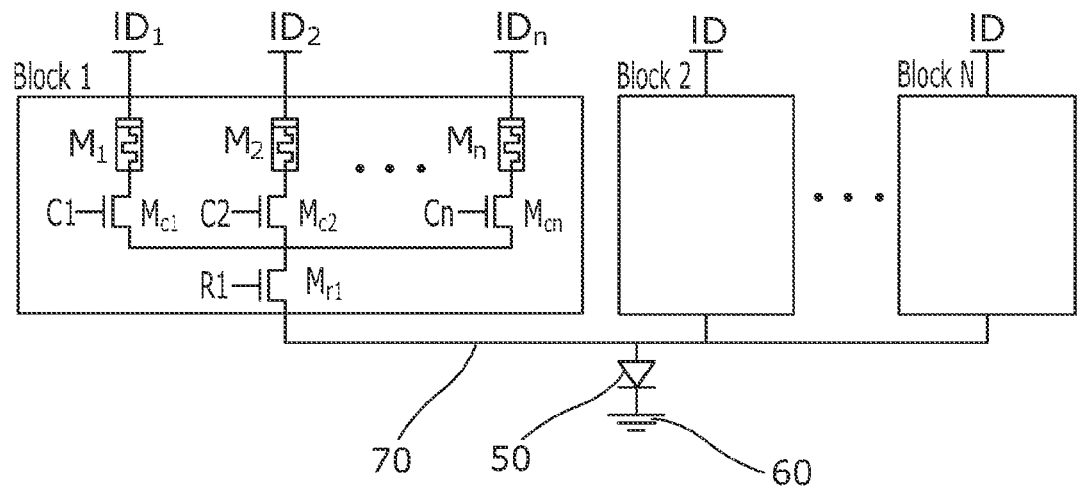
FIGS. 3A and 3B show other examples of a plurality of memory cells each including a memristor.

FIG. 3A shows another array of memory cells. The array includes a plurality of blocks. Each block incudes a plurality of memory cells, wherein each memory cell includes a column address switch. Each block also includes a row address switch that is shared between the plurality of memory cells in the block. The various blocks have outputs leading to a common line 70 to the circuit ground 60. A diode 50 is placed on the common line 70 to the circuit ground and acts as a one-way current conducting device to prevent the bi-polar memristors in the memory cells of each block from being reset.

Specifically, Block 1 includes a plurality of bi-polar memristors $M_1$ to $M_N$. Each memristor is coupled to a respective read line $ID_1$ to $ID_n$ that is to read the state of the memristor. Each memristor is coupled to a respective column switch $M_{C1}$ to $M_{CN}$. Each column switch is coupled to a respective column address line $C_1$ to $C_2$, whereby a signal on the column address line may turn on or off the column switch. For the column switches may be transistors with gates coupled to the column address lines. Each column switch in the block is coupled to the same row switch which acts as a row switch $M_{R1}$ for all memristors in the first block 1. Thus first memristor $M_1$ is selected when column switch $M_{C1}$ and row switch $M_{R1}$ are switched on to provide a conductive path between $ID_1$ and the common line 70 to circuit ground. Likewise, second memristor $M_2$ is selected when column switch $M_{C2}$ and row switch $M_{R2}$ are switched on. For simplicity, just the contents of the first block 1 are shown in FIG. 3A, but the structure and contents of the other blocks are the same. That is although just one ID line is shown for the other blocks in FIG. 3A, each block may have a plurality of read lines as shown for block 1. Likewise each read line may be coupled to a respective memristor and column switch as shown for block 1.

Each block has a respective row address switch $M_{R1}$ to $M_{RN}$ and each row address switch may be coupled to a respective row address line $R_1$ to $R_N$ which may carry a signal to turn on or off the row switch. Thus each block has its own row switch coupled to a row address line addressing that block. The column address lines may be multiplexed so that they can address memristors in several different blocks, e.g. column address line $C_1$ may be coupled to a first column switch in block 1, a first column switch in block 2 and a first column switch in block N etc.

A diode 50 is positioned on the common line 70 to circuit ground between the outputs of each block and the circuit ground 60. For example the diode 50 may have a first side coupled to a common line 70 leading to each of the row switches $M_{R1}$ to $M_{RN}$ and a second side coupled to the circuit ground 60. The diode acts as a one-way current conducting device to prevent resetting of the memristors in each of the blocks. As one diode 50 may perform this function for a plurality of blocks each including a plurality of memristors, a great deal of space may be saved compared to having a separate diode for each memristor.

Figure 3B:
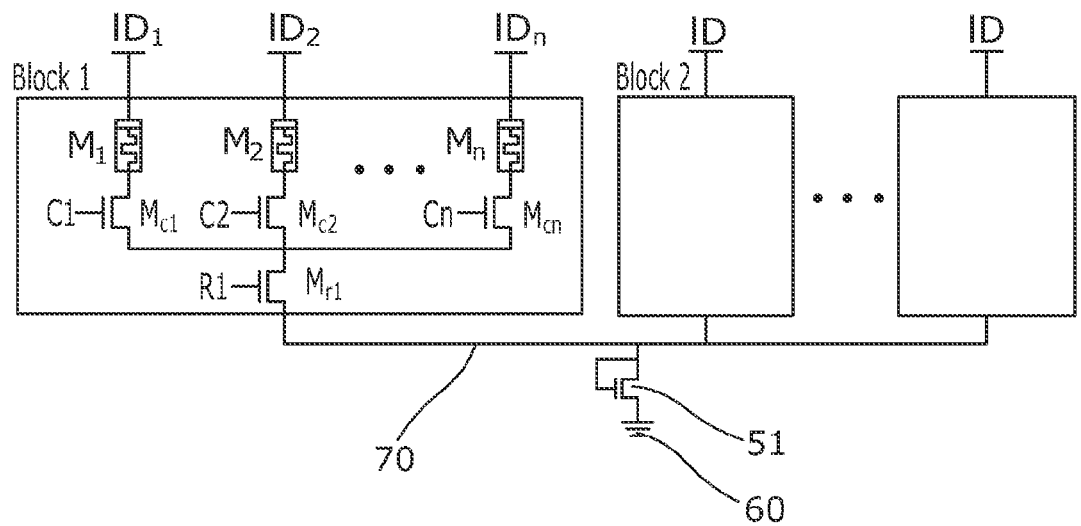

FIG. 3B shows a memory array similar to that of FIG. 3A, except that instead of a diode 50, a transistor 51 is provided on the common line 70 to circuit ground. A gate G of the transistor 51 is coupled to the drain D of the transistor, so that the transistor may act as a one-way current conducting device. For example, a drain D of the transistor and a gate of the transistor may be coupled to the outputs of each block and a source S of the transistor may be coupled to the circuit ground 60. In this way, even if a high voltage is applied to the circuit ground 60, the gate of the transistor 51 will still have a low voltage and thus the transistor will remain off and will not allow flow of current in the reverse direction from the circuit ground 60 to the read lines ID. This may effectively help to prevent resetting of the bi-polar memristors.

Figure 4:
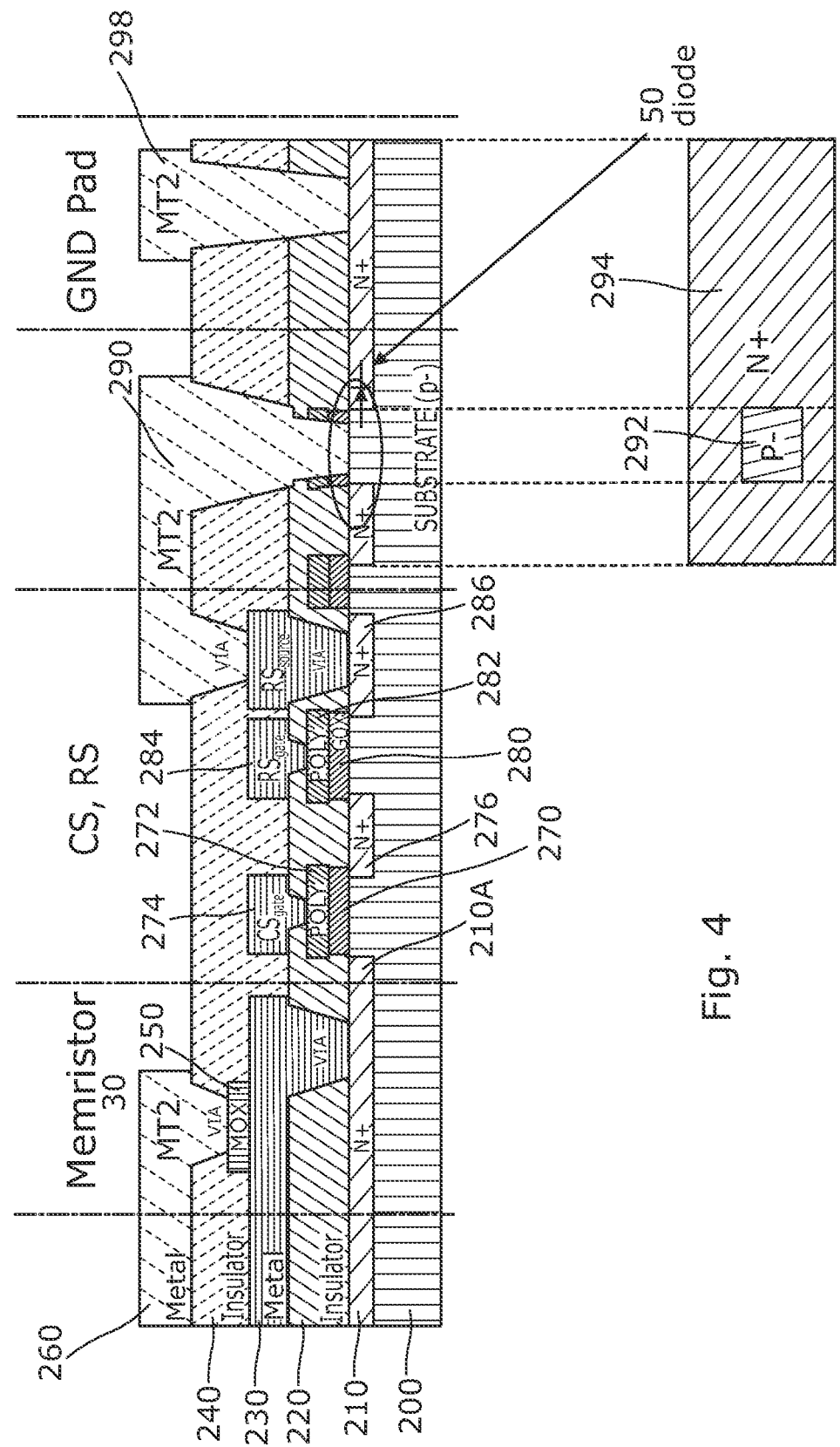
FIG. 4 shows an example structure of a memory cell and a diode.

FIG. 4 is a cross section view showing an example structure having several layers that may implement a memory circuit according to the present disclosure. The structure has a semiconductor substrate 210. The semiconductor substrate 200 is a p-layer which is lightly positively doped. However, certain regions of the substrate are N+ regions, which are heavily negatively doped. The junctions of the positively and negatively doped regions may be arranged to form field effect transistor switches or diodes.

Referring to the left of FIG. 4, a second metal layer 260 overlies a first metal layer 230 and is separated from the first metal layer by a second insulating layer 240. A via extends through the second insulating layer 240 and connects the second metal layer 260 with the first metal layer 230. As well as metal, the via includes a metal oxide layer 250. This structure forms a memristor 30.

The second metal layer 260 may be formed of any suitable conducting materials such as aluminum, copper and alloys thereof. In one example an alloy including aluminum and copper is used as the second metal layer. Any suitable conducting materials may be used in the first metal layer 230, such as aluminum, copper and alloys thereof. In one example an alloy including aluminum, copper and silicon is used as the first metal layer. The second insulating layer 240 may include any suitable electrically insulating material and in one example includes Tetraethyl orthosilicate.

The first metal layer 230 is connected to a negatively doped region 210 of the substrate 200 by a via that extends through a first insulating layer 220. Any suitable electrically insulating material may be used as the first insulating layer 220 and in one example Borophosphosilicate glass is used.

Moving further to the right of FIG. 4, a column switch CS and a row switch RS are depicted. The switches are field effect transistors. The memristor 30 is connected to the column switch by a negatively doped region 210 of the semiconductor substrate.

The drain of the column switch is formed by a part of the negatively doped region 210A of the substrate. Another negatively doped region 276 acts as the source of the column switch. The drain is separated from the source by a region of positively doped p-type substrate which forms part of the gate. The gate of the column switch further includes a silicon dioxide layer 270 and polysilicon layer 272 which lie above the substrate 200 and are connected to a gate contact 274. The gate contact 274 is in the first metal layer, but is isolated from the memristor. The gate contact 274 may connect to a column address line (not shown).

As mentioned above the source 276 of the column switch is provided by a negatively doped portion of the substrate 276. This negatively doped portion 276 also acts as a drain of the row switch RS. The source of the row switch is another negatively doped portion 286, which is separated from the drain by a positively doped region which forms part of the gate. The gate of the row switch further includes a silicon dioxide layer 280 and polysilicon layer 282 and a gate contact 284 in the first metal layer. The gate contact 284 may connect to a row line (not shown).

A connecting line 290 connects the source of the row switch 286 to a diode 50. The connecting line 290 corresponds to the common line to ground 70 mentioned in the circuit diagrams of FIGS. 2A, 2B, 3A and 3C. The connecting line 290 includes a connecting portion in the second metal layer and a first via to connect to the source of the row switch 286 and a second via to connect to the diode 50. The diode 50 is formed from a p-n junction in the substrate 200. A cross sectional view of the diode along the dotted lines is shown at the bottom of FIG. 4. The diode includes a small area 292 of lightly positively doped substrate that borders with a negatively doped region 294 of the substrate 200. The junction between the negatively doped material and positively doped substrate forms a diode. The positively doped region 292 may be surrounded on all sides by negatively doped material 294 as shown in the cross section. Surrounding the positively doped region in this way, rather than for example having a continuous strip of positively doped material extending through the substrate, may maximize the p-n contact and per unit area and reduce the forward resistance of the diode. The negatively doped region on the other side of the diode connects through a via to a ground pad 298 in the second metal layer on the top of the structure.

Figure 5:
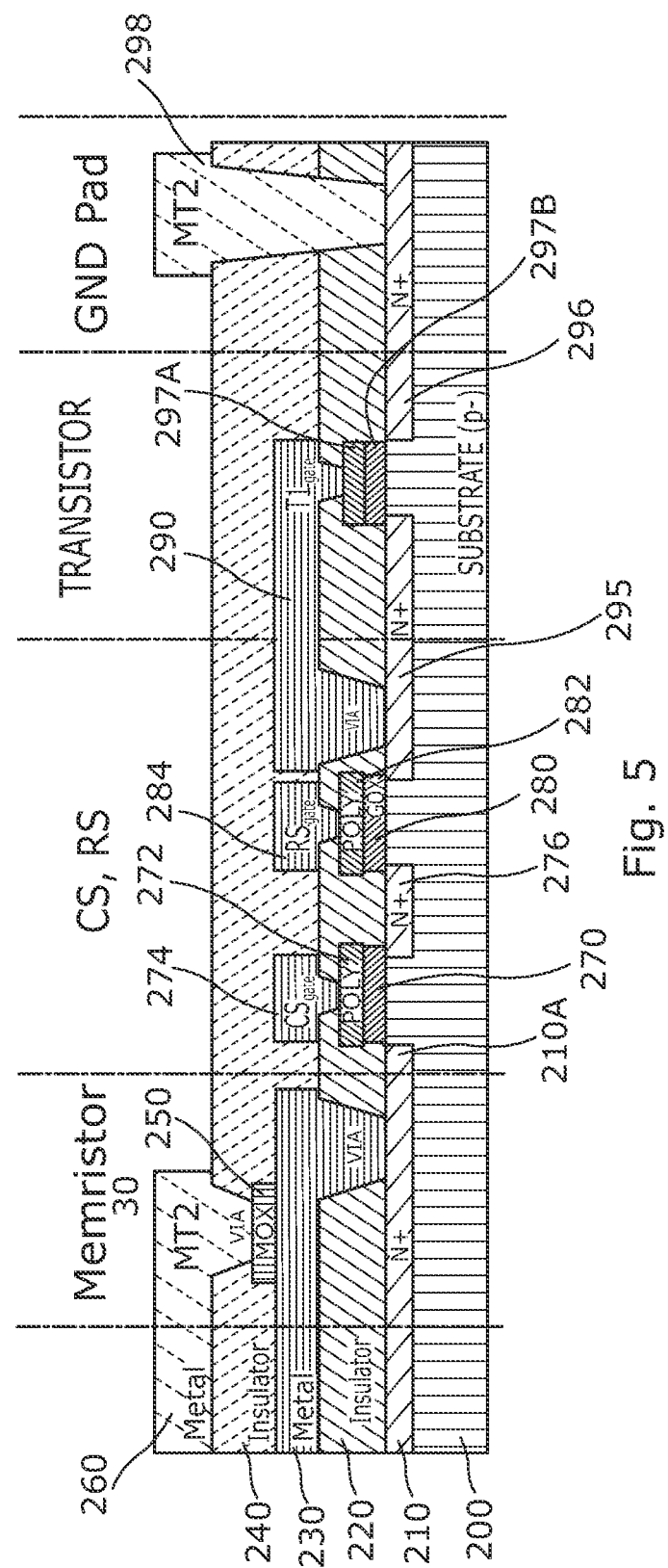
FIG. 5 shows another example structure of a memory cell and a transistor.

FIG. 5 shows a structure similar to FIG. 4, except that it has a drain-gate connected transistor 51 instead of a diode. Otherwise like reference numerals denote like parts as in FIG. 4. Similar to the column and row switches, the transistor 51 includes a drain 295 and a source 296 formed of negatively doped regions of the semiconductor substrate and a gate including a positively doped region, a silicon dioxide layer 297B, and a polysilicon layer 297A. Unlike the column and row switches, the drain 295 of the transistor is connected to the gate 297B, 297A by a conductive metal path 290. Specifically, in the example of FIG. 5, a connecting line on the first metal layer connects through a first via with the drain region of the transistor and through a second via with the gate of the transistor. In this way the gate is coupled to the drain and the transistor allows current to pass when the drain (and thus gate) voltage is high, but does not let current pass if the source voltage is higher than the drain (and gate) voltage.

Figure 6:
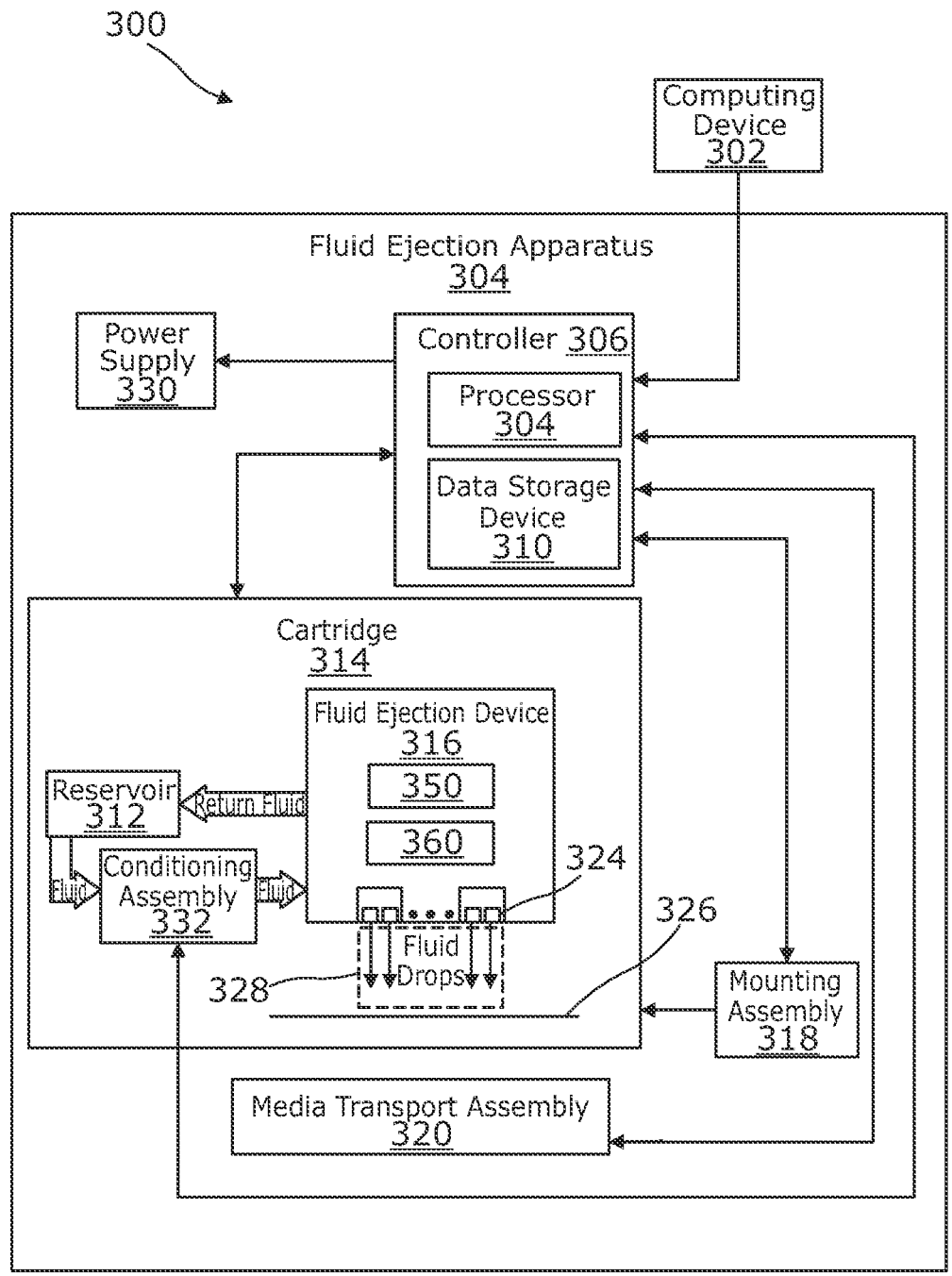
FIG. 6 shows an example of a fluid ejection device including a memory cell.

FIG. 6 shows one example of a system 300 that comprises a fluid ejection device 316 including a memristor circuit, or a memory array, 350 as described above. The system 300 includes a computing device 302 that is connected to a fluid ejection apparatus 304, such as a printer. The computing device may be connected by a direct wired connection, wireless connection or a computer network. The computing device may send instructions to a controller 306 to instruct printing or ejection of fluid in a precise manner. The controller 306 may be located in the apparatus 304 and may, for example, be an ASIC. The controller 306 may include a processor 308 and a data storage device 310. The controller 306 sends instructions to a fluid ejection device 316 to instruct printing or precision ejection of fluid.

The fluid ejection device 316 may form part of a fluid cartridge 314. For example the fluid cartridge may also include a fluid reservoir 312 and a fluid conditioning assembly 332 through which ink or other fluid is circulated to the fluid ejection device. In other examples the fluid ejection device may be separate and independent from the fluid cartridge, but receive fluid therefrom. A mounting assembly 318 and a media transport assembly 320 may move a media and the fluid ejection device relative to each other so that fluid may be ejected to a desired area of the media. The system may be powered by a power supply 330.

The fluid ejection device 316 includes a memristor circuit or a memory array 350. This may be used to identify the fluid ejection device to the controller 306. For example, the controller 306 may read and/or write to the memory array 350 to validate that the fluid ejection device is a genuine device that is suitable for use with the fluid ejection apparatus. As the memory array 350 uses memristors it may be relatively small and thus only occupy a relatively small space on the fluid ejection device, leaving other space free for other purposes. In one example the controller 306 is capable of delivering a single polarity of voltage in the signals it sends to the fluid ejection device, for instance positive voltages. With the memory array described above, memristor memory cells may still be set and reset even when a single polarity of voltage is delivered to the fluid ejection device.

The fluid ejection device also includes circuitry 360 to eject drops of fluid from apertures in the fluid ejection device. The circuitry may be receive instruction signals from the controller 306 and process these signals to eject fluid from particular fluid ejection apertures, for instance by heating of thermal ejection elements or otherwise. The memory array 350 and circuitry 360 may share some common circuit elements, for instance voltage input and/or some signal lines. This may save cost and minimize the space used on the silicon real estate of the fluid ejection device.

For example, they may be used in a fluid ejection device. One example of a fluid ejection device is a printhead for ejecting ink. However, a fluid ejection device is not limited thereto and may be used for ejecting magnetic substances, pharmaceuticals and other fluids. In one example the memristor or the memory array may be used for storing product identification data identifying the electronic device, or anti-counterfeit data, such as codes used to validate the electronic device as a genuine device which may be used with other equipment belonging to the same vendor.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A memory circuit including:
   a memory cell including an input coupled to a read line, an output coupled to a circuit ground, a bi-polar memristor and at least one address switch coupled to an address line to select the memory cell; and
   a one-way current conducting device to prevent resetting of the bi-polar memristor;
   wherein the one-way current conducting device is positioned between the memory cell output and the circuit ground, or between the read line and the memory cell input.

2. The memory circuit of claim 1 wherein the one-way current conducting device comprises a diode.

3. The memory circuit of claim 2 wherein a breakdown voltage of the diode is at least 10V.

4. The memory circuit of claim 1 wherein the one-way current conducting device comprises a transistor including a gate and a drain, wherein the gate of the transistor is coupled to the drain of the transistor.

5. The memory circuit of claim 1 wherein the memory circuit includes a plurality of memory cells, each memory cell being connected to a common line to the circuit ground and wherein the one-way current conducting device is positioned on the common line to the circuit ground to prevent resetting of the plurality of memory cells.

6. The memory circuit of claim 5 wherein the memory circuit includes a plurality of blocks, each block including a plurality of bi-polar memristors, each bi-polar memristor associated with a respective column switch and all bi-polar memristors in a block sharing a common row switch;
   wherein a plurality of row switches connect to the common line to the circuit ground and the one-way current conducting device is positioned on the common line to the circuit ground.

7. A fluid ejection device comprising:
   a memory cell on a conductive path between a read signal input line and a circuit ground;
   wherein the memory cell includes a bi-polar memristor and an address switch to select the bi-polar memristor; and
   a one-way current conducting device positioned between the memory cell and the circuit ground or between the read signal input line and the memory cell.

8. The fluid ejection device of claim 7 wherein the one-way current conducting device comprises an avalanche diode.

9. The fluid ejection device of claim 7 wherein the one-way current conducting device comprises a transistor including a gate, a drain and a source, wherein the gate and the drain are coupled to a same input.

10. An electronic device including a memory storing product identification and/or anti-counterfeit data; wherein the memory includes:
   a plurality of memory cells;
   each memory cell including an input coupled to a read line, an address switch to select the cell, a bi-polar memristor and an output;
   wherein the output of each of memory cell is coupled to a common line to a circuit ground that is shared between the plurality of memory cells; and
wherein a one-way current conducting device is positioned on the common line to the circuit ground to prevent resetting of the plurality of memory cells.

11. The electronic device of claim 10 wherein the one-way current conducting device comprises a diode.

12. The electronic device of claim 10 wherein the one-way current conducting device comprises a transistor including a gate and a drain, wherein
   both the gate of the transistor and the drain of the transistor are coupled to the outputs of the plurality of memory cells, and the source of the transistor is coupled to the circuit ground.

13. The memory circuit of claim 1 wherein the circuit is formed in a structure including a plurality of layers and wherein a drain and source of the address switch and the one-way current conducting device are formed from negatively doped regions and positively doped regions of a same layer of the structure.

14. The memory circuit of claim 1 wherein the circuit is formed in a structure including a plurality of layers, an upper layer of said structure being a metal layer including a read line and a ground pad, a semiconductor substrate of said structure including the address switch and the one-way current conducting device and wherein the ground pad is connected to the one-way current conducting device through a via.

15. The memory circuit of claim 1 wherein the one-way current conducting device comprises a p-n diode and a positively doped region of the p-n diode is connected to a source of the address switch by two vias and a metal layer.

* * * * *